United States Patent [19]

Tsui et al.

[11] Patent Number: 5,099,243
[45] Date of Patent: Mar. 24, 1992

[54] DIGITAL FREQUENCY MEASUREMENT RECEIVER WITH BANDWIDTH IMPROVEMENT THROUGH MULTIPLE SAMPLING OF COMPLEX SIGNALS

[75] Inventors: James B. Y. Tsui, Centerville; Richard B. Sanderson, Dayton, both of Ohio

[73] Assignee: The United States of America as represented by the Secretary of the Air Force, Washington, D.C.

[21] Appl. No.: 672,515

[22] Filed: Mar. 6, 1991

[51] Int. Cl.$^5$ ............................................. G01R 23/00
[52] U.S. Cl. ................................. 324/78 D; 342/14; 342/16; 342/18; 342/20; 324/83 Q; 324/79 R; 324/79 D; 324/77 B; 364/484
[58] Field of Search ................ 342/14, 16, 17, 18, 342/20, 98; 364/484; 324/77 B, 77 D, 78 D, 79 D, 83 Q, 83 D

[56] References Cited

U.S. PATENT DOCUMENTS

| | | | |
|---|---|---|---|
| 3,708,746 | 1/1973 | Willett et al. | 324/77 |
| 3,984,770 | 10/1976 | Chu | 364/484 |
| 4,336,541 | 6/1982 | Tsui et al. | 343/18 |
| 4,504,785 | 3/1985 | Tucker et al. | 324/77 |
| 4,633,516 | 12/1986 | Tsui | 455/226 |
| 4,893,266 | 1/1990 | Deem | 364/726 |
| 4,979,215 | 12/1990 | Fontanes | 364/484 |

Primary Examiner—Kenneth A. Wieder
Assistant Examiner—Jose M. Solis
Attorney, Agent, or Firm—Bernard E. Franz; Donald J. Singer

[57] ABSTRACT

This is a technique for extending the frequency range which employs in-phase and quadrature components of the signal coupled with non-uniform sampling to gain the advantages of a high sampling rate with only a small increase in the number of samples. By shifting the phase of the local oscillator by 90 degrees, a quadrature IF signal can be generated. Both in-phase and quadrature components are sampled and the samples are combined to form a complex signal. When this signal is transformed, only one alias is obtained per periodic repetition and the effective Nyquist frequency is doubled. Two sets of complex samples are then used with the slightly different sampling frequency. Each set is independently Fourier transformed and the frequency of the lowest aliases permits unambiguous determination of the signal frequency over a range far exceeding the Nyquist frequency.

2 Claims, 1 Drawing Sheet

DIGITAL FREQUENCY MEASUREMENT RECEIVER WITH BANDWIDTH IMPROVEMENT THROUGH MULTIPLE SAMPLING OF COMPLEX SIGNALS

RIGHTS OF THE GOVERNMENT

The invention described herein may be manufactured and used by or for the Government of the United States for all governmental purposes without the payment of any royalty.

CROSS REFERENCE TO RELATED APPLICATIONS

This is one of three related applications by the same applicants and filed on Mar. 6, 1991; (1) Digital Frequency Measurement Receiver With Bandwidth Improvement Through Multiple Sampling of Complex Signals, Ser. No. 07/672,515; (2) Digital Frequency Measurement Receiver With Bandwidth Improvement Through Multiple Sampling of Real Signals, Ser. No. 07/672,310; and (3) Instantaneous Frequency Measurement Receiver With Bandwidth Improvement Through Phase Shifted Sampling of Real Signals, Ser. No. 07/672,309.

BACKGROUND OF THE INVENTION

The present invention relates generally to a digital frequency measurement receiver with bandwidth improvement through multiple sampling of complex signals.

In a digital rf receiver, the incident radiation is mixed with a local oscillator signal and down converted to an intermediate frequency (IF). This IF signal is discretely sampled and further processing is done using digital techniques. The frequency of the incident radiation may be determined by performing a discrete Fourier transform on the sampled signal. The range of frequencies that can be determined by such methods is limited by aliasing effects that limit the frequency range to $\frac{1}{2}b$, the Nyquist frequency, where b is the uniform sampling interval. In order to measure frequencies over a wide range, a very high sampling frequency must be used.

U.S. patents of interest include U.S. Pat. No. 4,336,541, to Tsui, which teaches an IFM receiver that detects the difference of two or more RF signals between the onset of the first RF signal pulse and the completion of the frequency encoding strobe. U.S. Pat. No. 4,504,785 to Tucker teaches a sampling spectrum analyzer wherein an input signal is split and each resulting portion is passed down a tapped delay line with samples being taken at each tap processed by separate arithmetic units. U.S. Pat. No. 4,633,516 to Tsui teaches an IFM receiver with an A/D converter which permits elimination of a phase correlator. U.S. Pat. No. 3,708,746 to Willet teaches a system for analyzing the frequency of an incident signal including a digital filter wherein the center frequency of the incident signal is varied by changing the sampling rate.

SUMMARY OF THE INVENTION

An objective of the invention is to improve the bandwidth of a digital rf receiver that measures the frequency of an incident signal.

The invention relates to a technique for extending the frequency range which employs in-phase and quadrature components of the signal coupled with non-uniform sampling to gain the advantages of a high sampling rate with only a small increase in the number of samples. By shifting the phase of the local oscillator by 90 degrees, a quadrature IF signal can be generated. Both in-phase and quadrature components are sampled and the samples are combined to form a complex signal. When this signal is transformed, only one alias is obtained per periodic repetition and the effective Nyquist frequency is doubled. Two sets of complex samples are then used with the slightly different sampling frequency. Each set is independently Fourier transformed and the frequency of the lowest aliases permits unambiguous determination of the signal frequency over a range far exceeding the Nyquist frequency.

DETAILED DESCRIPTION

Figure 1:
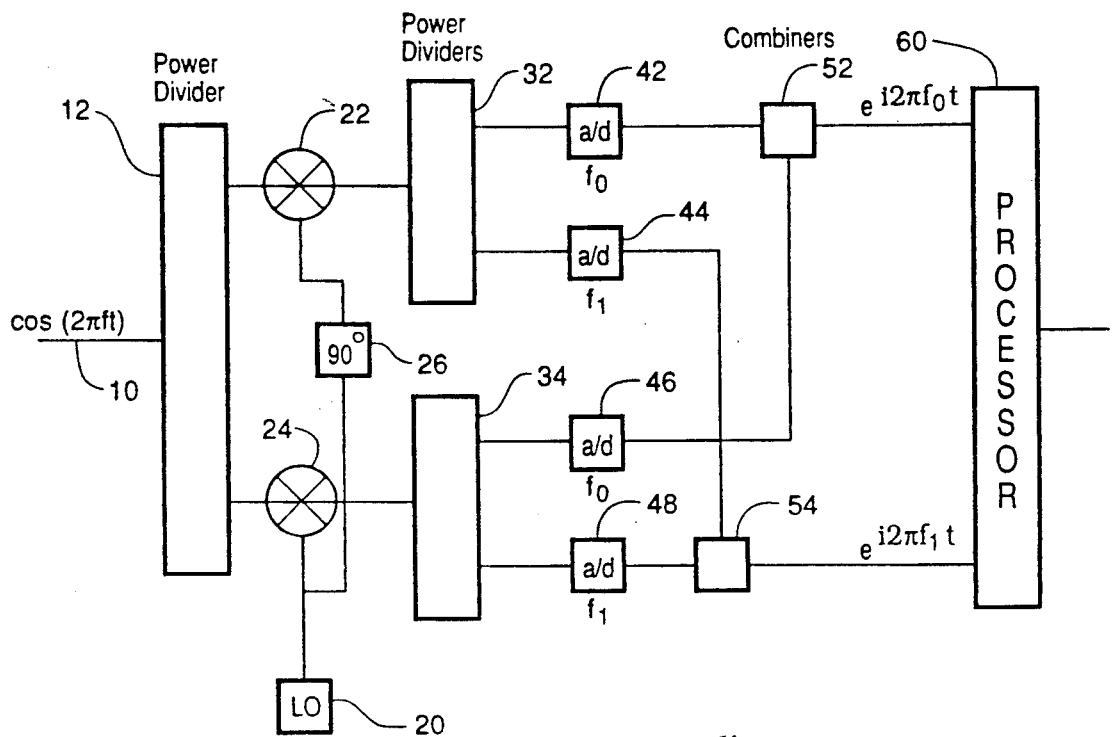
FIG. 1 is a functional block diagram showing an IFM receiver according to the invention.

This proposed approach to extending the frequency range uses in-phase and quadrature components of the signal coupled with non-uniform sampling to gain the advantages of a high sampling rate with only a modest increase in the number of samples. The basic idea is illustrated in FIG. 1. By shifting the phase of the local oscillator by 90 degrees, a quadrature IF signal can be generated. Both in-phase and quadrature components are sampled and the samples are combined to form a complex signal. When this signal is transformed, only one alias is obtained per periodic replica and the effective Nyquist frequency is doubled. We then use two sets of complex samples with slightly different sampling frequency. Each set of samples is Fourier transformed independently and the frequency of the lowest aliases determined. It is shown that knowledge of these two alias frequencies permits unambiguous determination of the signal frequency over a range far exceeding the Nyquist frequency.

In FIG. 1, the incoming RF signal $\cos(2\pi ft)$ on line 10 is divided in power divider 12 and supplied to two mixers 22 and 24 for down conversion to the intermediate frequency (IF). The signal from a local oscillator 20 is applied directly to the mixer 24 and shifted 90 degrees in unit 26 for the mixer 22, to obtain in-phase and quadrature components. The quadrature component from mixer 22 is divided in a power divider 32 and supplied to two analog-to-digital converters 42 and 44. The in-phase component from mixer 24 is divided in a power divider 34 and supplied to two analog-to-digital converters 46 and 48. The converters 42 and 46 are operated at a sampling frequency $f_0$, and the converters 44 and 48 are operated at a sampling frequency $f_1$. The quadrature and in-phase components for the $f_0$ sampling are combined in unit 52 to provide the complex signal $e^{i2\pi f_0 t}$ (or $\cos 2\pi f_0 t + i \sin 2\pi f_0 t$), and the quadrature and in-phase components for the $f_1$ sampling are combined in unit 54 to provide the complex signal $e^{i2\pi f_1 t}$ (or $\cos 2\pi f_1 t + i \sin 2\pi f_1 t$). The signals from the combiners 52 and 54 are then supplied to a processor 60 to determine the frequency f.

Figure 2:
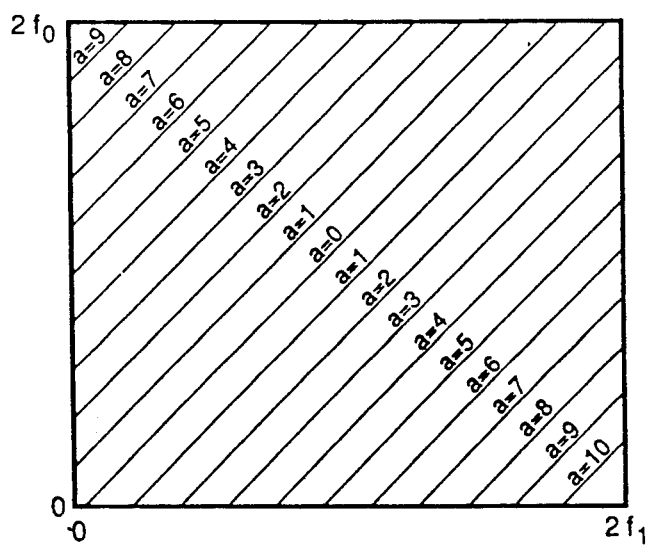
FIG. 2 is graph showing the effect of using two sets of samples of different frequency.

The effect of using two sets of samples of different frequency is illustrated in FIG. 2. The two Nyquist frequencies are $f_0$ and $f_1$ (assumend $> f_0$). The lowest alias for the $f_1$ sampling is plotted on the x axis and the lowest alias for the $f_0$ sampling is plotted on the y axis.

The curve of possible values lies on a set of lines formed by a 45 degree line starting at the origen. When a line reaches a boundary at $x=2f_1$ or at $y=2f_0$, it jumps to $x=0$ or $y=0$ respectively. Ultimately, it retraces itself. If, for convenience, $f_0$ and $f_1$ are chosen such that $f_0/(f_1-f_0)$ is integral, then retrace occurs at frequency, $f=f_0*f_1/(f_1-f_0)$. The line spacing is $2*(f_1-f_0)$. The frequency can be determined by calculating the parameter:

$$a=(y-x)/[2*((f_1-f_0)]\qquad(1)$$

This parameter must be an integer if the data point is to lie on a line and the measurement is to be valid. If the condition $f_0/(f_1-f_0)=n$, an integer, holds, then the frequency is represented in closed form.

$$f=2f_1((n+a)\bmod n)-x \text{ if } a \text{ integral}\qquad(2)$$

It is not essential that the condition $f_0/(f_1-f_0)=n$ hold. In that case, the expression in equation (2) can be replaced by a look-up table that identifies the frequencies associated with each line. Summary: Increasing the number of samples by a factor of four permits increasing the spectral range by factors of the order of ten or more. For example, if $f_0=100$ MHz and $f_1=110$ MHz, the spectral range is extended from 100 MHz to 1100 MHz. The increase is limited by the increasing fineness of the line spacing which ultimately makes it impossible to distinguish on which branch the data point lies. The technique works because the combination of different sampling frequencies leaves at least some pairs of narrowly spaced sampling points which provide the information to characterize the high frequency components.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver comprising: first power dividing means coupling a source of RF signals to inputs of two mixers for down conversion to an intermediate frequency (IF), a local oscillator coupled directly to one of the mixers to provide an in-phase component, the local oscillator being coupled via 90-degree phase shift means to the other mixer for providing a quadrature component, second power dividing means coupling the mixer providing the in-phase component to first and second analog-to-digital converters, third power dividing means coupling the mixer providing the quadrature component to third and fourth analog-to-digital converters, the first and third analog-to-digital converters being operated at a first sampling frequency $f_0$, and the second and fourth analog-to-digital converters being operated at a second sampling frequency $f_1$, means combining the in-phase and quadrature components from the first and third analog-to-digital converters for the first sampling frequency $f_0$ and supplying the output to processing means to provide a first complex signal, means combining the in-phase and quadrature components from the second and fourth analog-to-digital converters for the second sampling frequency $f_1$ and supplying the output to said processing means to provide a second complex signal;

wherein said processing means comprises means for performing discrete Fourier transforms independently on said first and second complex signals, so that only one alias is obtained per periodic repetition and the effective Nyquist frequency is doubled, a lowest alias for the $f_1$ sampling being used as an x value, and a lowest alias for the $f_0$ sampling being used as a y value, with a function of possible values for the frequency f being a set, one of which is a line having equal x and y values, and the others being lines parallel thereto, the frequencies $f_0$ and $f_1$ being chosen such that $f_0/(f_1-f_0)$ is an integer n, so that a retrace occurs at frequency, $f=f_0*f_1/(f_1-f_0)$ with a line spacing of $2*(f_1-f_0)$, and the frequency is determined by calculating the parameter:

$$a=(y-x)/[2*((f_1-f_0)]$$

this parameter being an integer, so that the frequency is represented in closed form as $$f=2f_1((n+a)\bmod n)+x \text{ if } a \text{ integral}.$$

2. A frequency measurement receiver comprising: first power dividing means coupling a source of RF signals to inputs of two mixers for down conversion to an intermediate frequency (IF), a local oscillator coupled directly to one of the mixers to provide an in-phase component, the local oscillator being coupled via 90-degree phase shift means to the other mixer for providing a quadrature component, second power dividing means coupling the mixer providing the in-phase component to first and second analog-to-digital converters, third power dividing means coupling the mixer providing the quadrature component to third and fourth analog-to-digital converters, the first and third analog-to-digital converters being operated at a first sampling frequency $f_0$, and the second and fourth analog-to-digital converters being operated at a second sampling frequency $f_1$, means combining the in-phase and quadrature components from the first and third analog-to-digital converters for the first sampling frequency $f_0$ and supplying the output to processing means to provide a first complex signal, means combining the in-phase and quadrature components from the second and fourth analog-to-digital converters for the second sampling frequency $f_1$ and supplying the output to said processing means to provide a second complex signal;

wherein said processing means comprises means for performing discrete Fourier transforms independently on said first and second complex signals, so that only one alias is obtained per periodic repetition and the effective Nyquist frequency is doubled, a lowest alias for the $f_1$ sampling being used as an x value, and a lowest alias for the $f_0$ sampling being used as a y value, with a function of possible values for the frequency f being a set, one of which is a line having equal x and y values, and the others being lines parallel thereto, and the frequency is determined by calculating the parameter:

$$a=(y-x)/[2*((f_1-f_0)].$$

a look-up table that identifies the frequencies associated with said function, and means using the look-up table for determining the frequency f.

* * * * *